United States Patent [19]
Lee et al.

[11] Patent Number: 5,913,122
[45] Date of Patent: Jun. 15, 1999

[54] METHOD OF MAKING HIGH BREAKDOWN VOLTAGE TWIN WELL DEVICE WITH SOURCE/DRAIN REGIONS WIDELY SPACED FROM FOX REGIONS

[75] Inventors: Jian-Hsing Lee, Chinchu; Kuo-Reay Peng, Hsin-chu; Jung-Ke Yeh, Hsin-chu; Hsiu-Han Liao, Hsin-chu, all of Taiwan

[73] Assignee: Taiwan Semiconductor Manufacturing Company, Ltd., Hsin-Chu, Taiwan

[21] Appl. No.: 08/789,717

[22] Filed: Jan. 27, 1997

[51] Int. Cl.[6] .................................................. H01L 21/336
[52] U.S. Cl. ............................................ 438/297; 438/527
[58] Field of Search ................................. 437/34, 44, 57; 438/305, 519, 297, 528, 527

[56] References Cited

U.S. PATENT DOCUMENTS

| | | |
|---|---|---|
| 4,918,510 | 4/1990 | Pfiester . |
| 5,494,843 | 2/1996 | Huang ........................................ 437/56 |
| 5,514,889 | 5/1996 | Cho et al. ................................. 257/316 |
| 5,712,173 | 1/1998 | Liu et al. . |

*Primary Examiner*—Richard A. Booth
*Attorney, Agent, or Firm*—George O. Saile; Stephen B. Ackerman; Graham S. Jones, II

[57] ABSTRACT

An FET semiconductor device comprises a doped silicon semiconductor substrate having surface. The substrate being doped with a first type of dopant. An N-well is formed within the surface of the P-substrate. A P-well is formed within the N-well forming a twin well. Field oxide regions are formed on the surface of the substrate located above borders between the wells and regions of the substrate surrounding the wells. A gate electrode structure is formed over the P-well between the field oxide regions. A source region and a drain region are formed in the surface of the substrate. The source region and the drain region are self-aligned with the gate electrode structure with the source region and the drain region being spaced away from the field oxide regions by a gap of greater than or equal to about 0.7 $\mu$m.

20 Claims, 9 Drawing Sheets

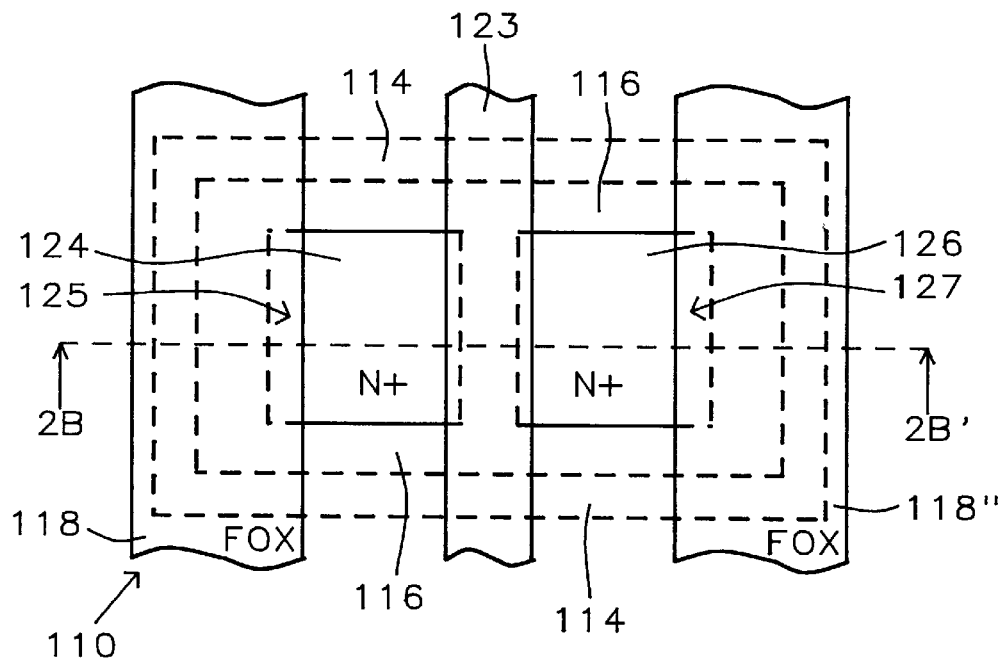
FIG. 2A – Prior Art
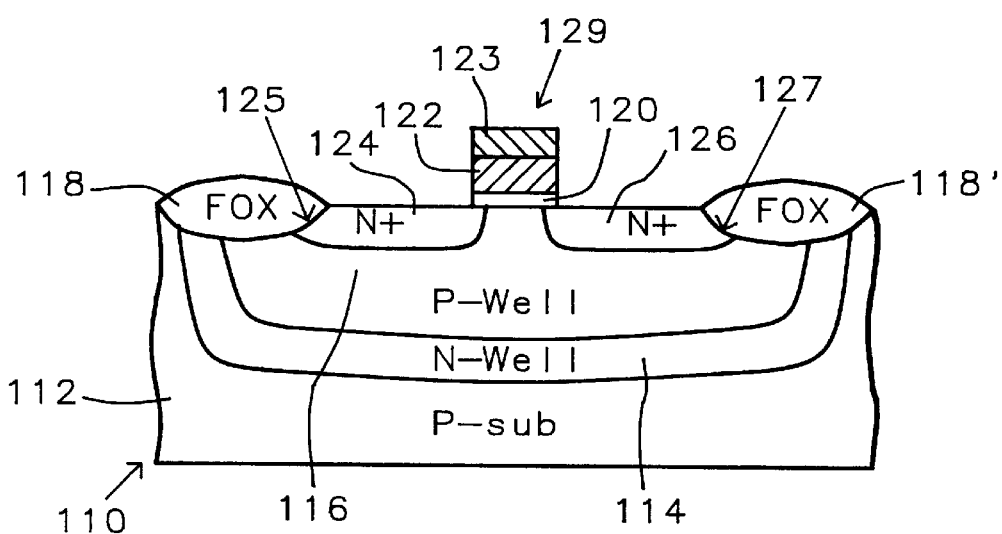
FIG. 2B – Prior Art

*FIG. 2C - Prior Art*

METHOD OF MAKING HIGH BREAKDOWN VOLTAGE TWIN WELL DEVICE WITH SOURCE/DRAIN REGIONS WIDELY SPACED FROM FOX REGIONS

BACKGROUND OF THE INVENTION

1. Field of the Invention

This invention relates to semiconductor devices including memory transistors, and more particularly to transistor semiconductor device including field oxide structures above a well.

2. Description of Related Art

The redistribution of phosphorus (P) during thermal oxidation and the redistribution of phosphorus (P) at Field OXide (FOX) interfaces are generally known. Sea Sze , "VLSI Technology", McGraw Hill Book Company, pp. 129–131 (1988). For example, a P-field implant (B+ 150 keV 4E12 ions/cm$^{-2}$) was implanted through the FOX to compensate for the concentration loss. After this process, for the FOX region, the maximum boron concentration to just below the FOX region. For the φ active region, the maximum boron concentration is far away from the active N+ region.

U.S. Pat. No. 5,430,324 of Bencuya for "High Voltage Transistor Having Edge Termination Utilizing Trench Technology" shows multiple transistor cells with spaced apart field oxide regions rings. Bencuya forms trenches between insulating regions in order to increase breakdown voltages. However, the use of the trench isolation technique differs from the present invention which avoids the use of trench isolation structures to achieve the objective of avoiding breakdown, by effectively increasing the voltage at which breakdown would occur.

Increasing the spacing between doped regions is generally known to reduce concentrations of dopant and to raise breakdown voltages. Although providing added spacing between doped regions and use of isolation regions is generally known to raise breakdown voltages the above prior art does not deal with application of this principle to the conventional design in which the doped source/drain regions overlap with field oxide regions to maximize density of devices in a CMOS type of device.

FIG. 2A shows a prior art plan view layout of a device 110 in which a breakdown condition can occur.

FIG. 2B is a cross-section of the device 110 shown in FIG. 2A, taken along line 2B–2B' in FIG 2A.

As shown in FIG. 2A, the device 110 is formed on a P-doped silicon semiconductor substrate 112 on which field oxide (FOX) silicon dioxide regions 118, 118' have been formed on the left and the right of the device 110. An N-well 114 has been formed in the substrate 112 between and below the FOX region 118 and the FOX region 118'. Within the N-well 114 a P- well 116 is formed which extends beneath much of the lower surface area of the FOX regions 118, 118'. On the surface of the P-well is formed a gate electrode stack 129 of a gate oxide layer 120, a polysilicon layer 122 and a polycide (refractory metal silicide) layer 123. A set of self-aligned N+ doped source/drain regions 122/126 have been formed in the P-well 116. Source region 124 extends to the left beneath the FOX region 118. Drain region 126 extends to the right beneath the FOX region 118'. Between the FOX region 118 and the source region 124 is an overlap region 125. Between the FOX region 118' and the drain region 126 is an overlap region 127, which can be seen in greater detail in FIG. 2A where the full area of overlap is illustrated.

FIG. 2C shows the device 110 of FIG. 2A modified slightly to illustrate in somewhat exaggerated dimensions the fact that the P-well region 116 may have a modified thickness where the regions 116' have been raised by the manufacturing process to provide narrow necks 130 and 131 between the source region 124 and the drain region 126 respectively and the N-well 114.

In the device 110 of FIG. 2C, breakdown often occurs in the overlap regions 125 and 127 between the FOX regions 118 and M+ source/drain regions 122/126 due to high doping concentration of phosphorus from N+ source/drain regions 122/126. For boron concentration distribution, due to thermal oxidation during manufacturing, as shown in FIG. 4 by the chart of the ratio $C_S/C_B$ vs. temperature from 900° C. to 1300° C. showing the effects of redistribution of boron during thermal oxidation $C_B$=1×10$^{16}$cm$^{-3}$, where:

$C_S$=Surface Concentration of Phosphorus and $C_B$=Bulk Concentration of Phosphorus.

Curves are shown for Dry oxygen (Dry O$_2$), which is the upper curve, and for oxygen through −97° C. water, which is the lower curve.

To compensate for this concentration loss, an additional (P-F field B+ 150 keV 4E12 ions/cm$^{-2}$) implantation was added such that the maximum boron concentration contacts with the maximum phosphorus concentration in FOX regions 125, 127 and builds a high field. But the maximum boron concentration is far away from the bottom of drain region 126 so this field is smaller than the field in the FOX regions 125, 127.

Especially emphasizing (0.5 μm flash EPROM) with a twin well arrangement with a P-well formed in an N-well, an N+ region in a buried P-Well rule. There is an extension of the N+ active area to N+ implant areas 0.5 μm due to process fluctuation. The N+ implant will diffuse to the FOX region due to lateral diffusion.

The FIG. 2C rule has a value≦0 μm and has an N+ junction breakdown<7 volts.

This invention can be employed in a P-well, formed in an N-substrate, in the absence of the N-well, also.

FIG. 2D shows three curves of concentration of dopant (logarithmic) in atoms/cm$^3$, as a function of distance in micrometers with a curve for P$^{11}$ and a curve for B$^{11}$, up to about 10$^{17}$ atoms/cm$^3$. In FIG. 2D, there is a curve with X$_1$, X$_2$, and X$_{nu11}$ at about 0.4 micrometers.

SUMMARY OF THE INVENTION

In accordance with this invention, a method is provided for forming in a doped silicon semiconductor substrate having a surface an FET semiconductor device with source/drain regions doped with a first type of dopant formed in a well in the substrate, the well is doped with an opposite type of dopant from the source/drain regions, field oxide regions formed on the surface of the substrate located above borders between the wall and regions of the substrate surrounding the well. Form a gets electrode structure over the well between the field oxide regions. Then, form a mask over the device covering the substrate including field oxide regions with a margin extending beyond the field oxide regions while providing source/drain openings through the mask spaced away from the field oxide regions. Ion implant a source region and a drain region in the surface of the substrate, the source region and the drain region are self-aligned with the gate electrode structure with the source region and the drain region spaced away from the field oxide regions.

Preferably, the source/drain dopant comprises arsenic ion-implanted at an energy of about 60 keV in a dose from about $5 \times 10^{20}$ ions/cm$^2$ to about $2 \times 10^{16}$ ions/cm$^2$ through the source/drain mask; the source/drain regions extend below the surface of the substrate from about 0.2 μm to about 0.3 μm deep; the well is doped by dopant comprising boron ion-implanted at an energy of about 40 keV in a dose from about $5 \times 10^{15}$ ions/cm$^2$ to about $2 \times 10^{16}$ ions/cm$^2$ through the source/drain mask.

Further in accordance with this invention, A method of forming an FET semiconductor device in a doped silicon semiconductor substrate substrate having a surface. The substrate is doped with a first type of dopant. An N-well is formed in the surface of the substrate. The N-well is doped with an opposite type of dopant from the first type. A P-well is formed in the N-well. The P-well is doped with the first type of dopant. The field oxide regions are formed on the surface of the substrate located above borders between the wells and regions of the substrate surrounding the wells. Form a gate electrode structure over the P-well between the field oxide regions. Form a mask over the device covering the substrate and field oxide regions with a margin extending beyond the field oxide regions while providing source/drain openings through the mask spaced away from the field oxide regions. Ion implant source/drain regions in the surface of the P-well, with the source region and the drain region being self-aligned with the gate electrode structure and with the source region and the drain region being spaced away from the field oxide regions by a gap of greater than or equal to about 0.7 μm.

Preferably, the source/drain dopant comprises arsenic ion-implanted with a dose from about $5 \times 10^{20}$ ions/cm$^2$ to about $1 \times 10^{21}$ ions/cm$^2$ at an energy of about 60 keV through the source/drain mask; the source/drain regions extend below the surface of the P-well from about 0.2 μm to about 0.3 μm deep; the N-well is doped by dopant comprising phosphorus ion-implanted in a dose from about $5 \times 10^{15}$ ions/cm$^2$ to about $2 \times 10^{16}$ ions/cm$^2$ at an energy of about 120 keV through the source/drain mask. The P-well is doped by dopant comprising boron ion-implanted at an energy of about 40 keV in a dose from about $5 \times 10^{15}$ ions/cm$^2$ to about $2 \times 10^{16}$ ions/cm$^2$ through the source/drain mask. Preferably, LDD dopant for the source/drain regions comprises phosphorus ion-implanted at an energy of about 60 keV in a dose from about $5 \times 10^{17}$ ions/cm$^2$ to about $1 \times 10^{18}$ ions/cm$^2$ through the source/drain mask.

This invention also comprises a method for forming an FET semiconductor device in a doped silicon semiconductor substrate having a surface. Dope the substrate with a P type of dopant. Form an N-well, doped with an N type of dopant, in the surface of the substrate from about 1.8 μm to about 4 μm deep. Form a P-well, doped with a P type of dopant, in the surface of the N-well from about 0.4 μm to about 1 μm deep. Form field oxide regions on the surface of the substrate located above borders between the N-well, the P-well and regions of the substrate surrounding the wells. Form a gate electrode structure over the well including a gate oxide layer about 100 Å thick, a polysilicon layer about 1,500 Å thick and a polycide layer about 1,500 Å thick between the field oxide regions. Form a mask over the device covering the substrate including field oxide regions with a margin extending beyond the field oxide regions while providing source/drain openings through the mask spaced away from the field oxide regions. Ion implant a source region and a drain region in the surface of the substrate with the source region and the drain region being self-aligned with the gate electrode structure. The source region and the drain region are spaced away from the field oxide regions by a distance greater than or equal to about 0.7 μm.

BRIEF DESCRIPTION OF THE DRAWINGS

The foregoing and other aspects and advantages of this invention are explained and described below with reference to the accompanying drawings, in which:

FIG. 2A shows a plan view layout of a device in which a breakdown condition can occur in a conventional prior art device.

FIG. 2B is a cross-section of the device of FIG. 2A taken along line 2B–2B' in FIG. 2A.

FIG. 2C shows the device of FIG. 2A modified slightly to illustrate, in somewhat exaggerated dimensions the fact that the P-well region may have a modified thickness where regions have been raised by the manufacturing process to provide narrow necks between the source region and the drain region respectively and the N-well.

DESCRIPTION OF THE PREFERRED EMBODIMENT

Figure 1A:
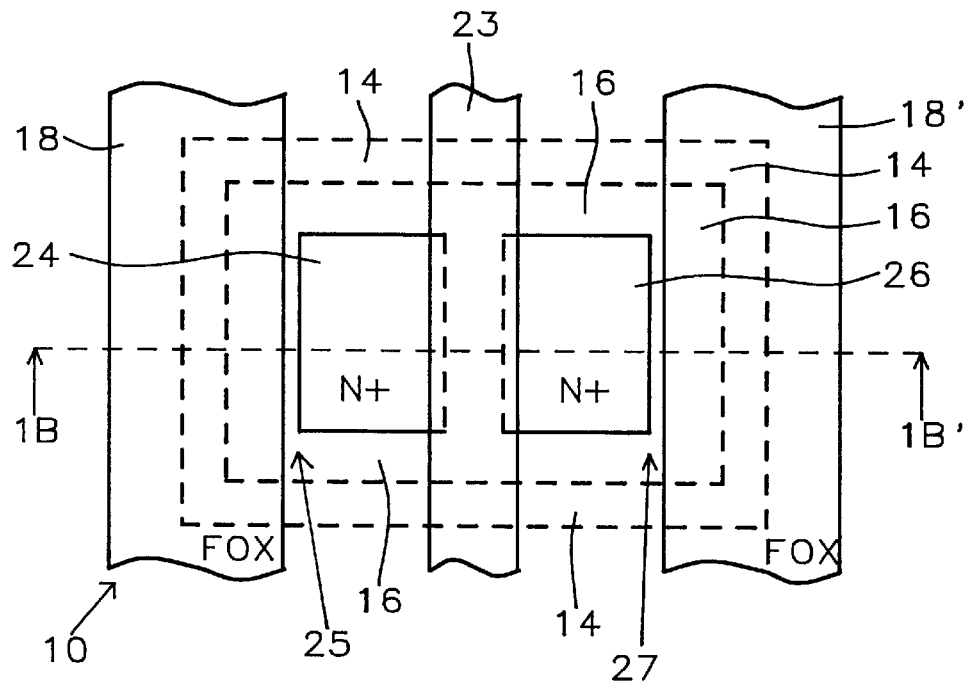
FIG. 1A shows a plan view layout of a device in accordance with this invention.

The structure of a device in accordance with this invention is described below with reference to FIGS. 1A–1B and 3A–3G. The design of this device makes it possible to avoid the breakdown condition, especially as contrasted to the conventional device 110 of FIGS. 2A–2C. The device 10 described herein is an example of a (Complementary Metal Oxide Semiconductor (CMOS) device.

A logic circuit in accordance with this invention includes additional features of a memory device, not shown in the drawings as will be well understood by those skilled in the art. The detailed structures of a RAM, an EPROM, and peripheral circuits are not shown in the drawings since they are well known to those skilled in the art; and alternatively, the invention could be embodied in a flash EPROM device, but for convenience of description, a simple FET device 10 is shown.

Figure 1B:
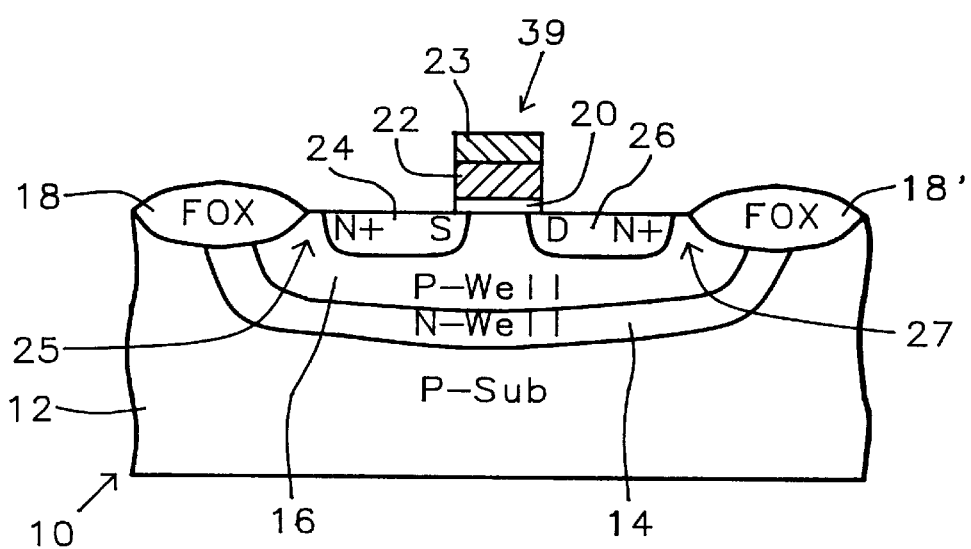
FIG. 1B is a cross-section of the device of FIG. 1A taken along line 1B–1B' in FIG. 1A.
Figure 2D:
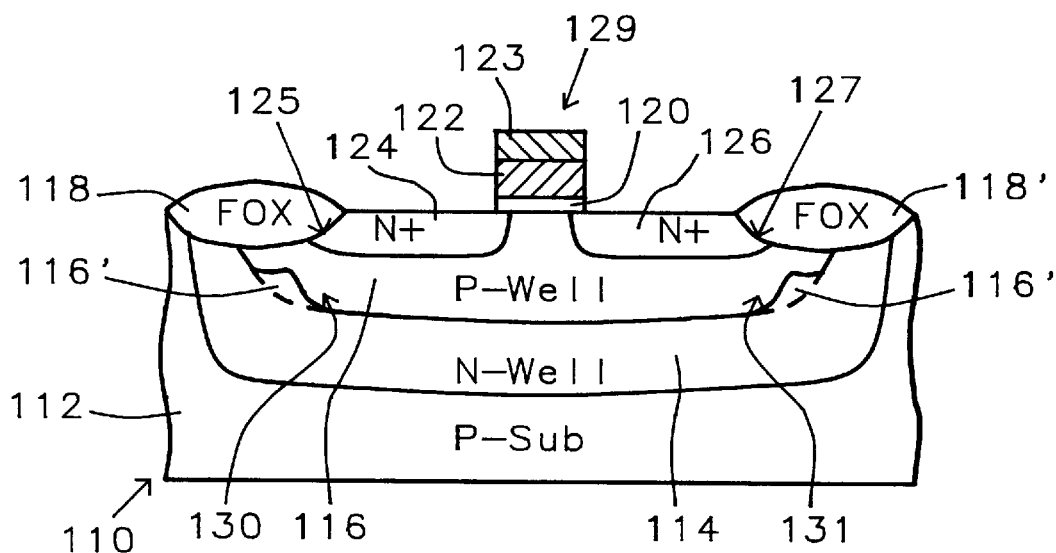
FIG. 2D shows three curves of concentration of dopant as a function of distance.
Figure 2D:
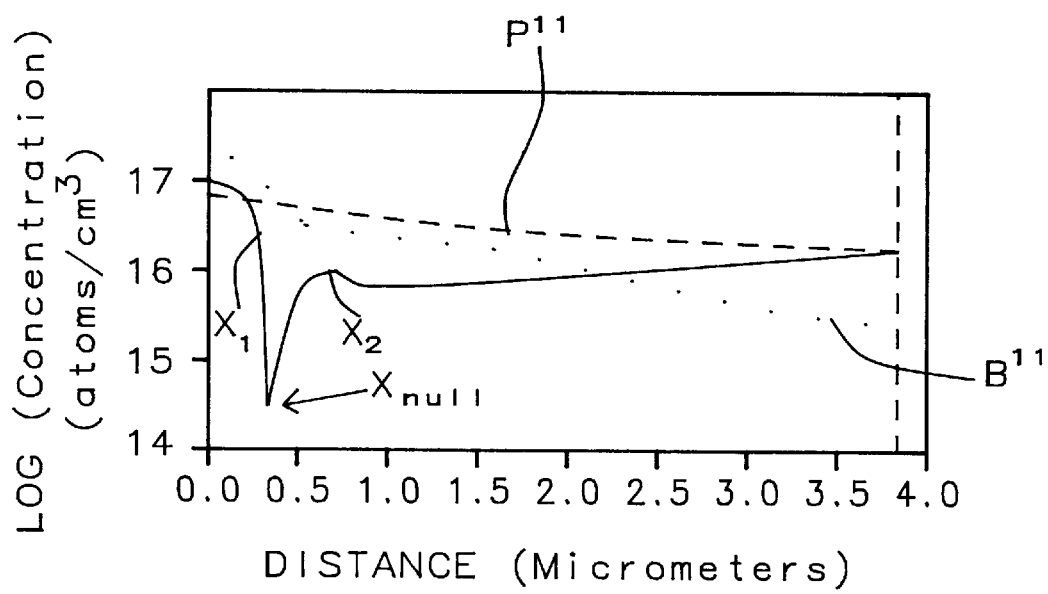

FIG. 1A shows a plan view layout of the device 10 in accordance with this invention. The device 10 is formed on a P- doped silicon semiconductor substrate 12 on which field oxide (FOX) silicon dioxide regions 18, 18' have bean formed on the left and the right of the device 10, as can be seen in FIG. 1B, which is a cross-section of the device 10 taken along line 1B–1B' in FIG. 1A.

An N-well 14 has been formed in the substrate 12 between and below the FOX region 18 and the FOX region 18'. The N-well 14 is doped with atoms of phosphorus dopant with a concentration from about $5 \times 10^{15}$ atoms/cm$^3$ to about $1 \times 10^{16}$ atoms/cm$^3$. The N-well 14 is from about 1.8 μm to about 4 μm deep.

Within the N-well 14, a P- well 16 is formed from about 0.4 μm to about 1 μm deep doped with atoms of boron dopent with a concentration from about $1 \times 10^{16}$ atoms/cm$^3$ to about $2 \times 10^{16}$ atoms/cm$^3$. P-well 16 extends beneath a small portion of the lower surface area of the FOX regions 18, 18' as contrasted with the P-well in FIGS. 2A–2C. Beneath the FOX regions 18, 18', the N-well separates the P-well from the substrate 12, laterally, by a distance from about 14 μm to about 24 μm. The N-well 14 and P-well 16 form a twin well structure.

On the surface of the P-well 16 is formed a gate electrode stack 39 including a gets oxide layer 20, a polysilicon layer 22 and a polycide (refractory metal silicide) layer 23.

A source region 24 extends to the left spaced away from the FOX region 18 by a gap 25 having a width of greater than or equal to about 0.7 μm. Similarly, a drain region 26 extends to the right, spaced away from the FOX region 18' by a gap 27 having a width greater than or equal to about 0.7 μm wide, as contrasted with FIGS. 2A–2C, where the source and drain regions extend beneath the FOX regions 118/118' which led to the problem of breakdown in the prior art. In FIGS. 1A and 1B, the spacing of the sources/drain regions 24/26 from the FOX regions 18/18' avoids that problem. The full extent of the gaps 25 and 27 can be seen in greater detail in FIG. 1A where the gaps 25 and 27 are shown in the plan view. The source region 24 and the drain region 26 are about 0.2 μm deep, below the surface of substrate 12.

In addition, there is a spacing between the source/drain regions 24/26 and the N-well 14 which raises the breakdown voltage to about 13 Volts, which is acceptable since the device is operated at a voltage of about 12 Volts.

FIGS. 3A–3G are cross-sectional views showing a process for manufacturing a portion of a CMOS semiconductor device 10 of FIGS. 1A–1B in accordance with this invention. As is conventional in this art, in order to simplify the description, the structure of only one memory FET device 10 is shown, but those skilled in the art will understand how this invention fits into the context of an overall device.

Figure 3A:
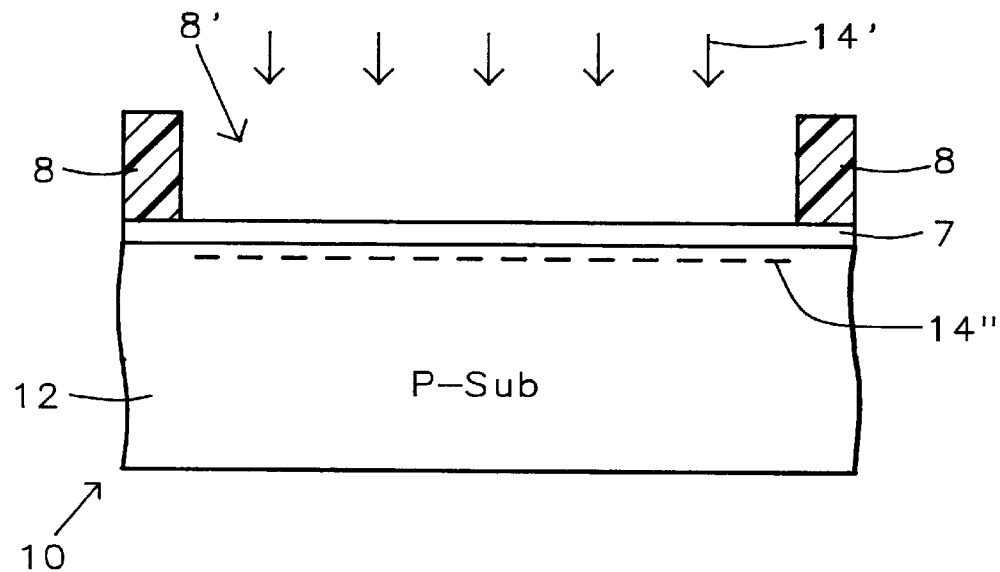
FIG. 3A shows a sectional view of a device in accordance with this invention in an early stage of manufacture starting with a silicon substrate on which a silicon dioxide film has been formed with a mask formed for doping the N-well region in the substrate.

Referring to FIG. 3A, the device 10 is shown in a very early stage of manufacture starting with a P type silicon substrate 12. A silicon dioxide film 7 having a thickness of about 250 Å is formed on a major surface of the silicon P-substrate 12 by thermal oxidation.

A photoresist mask 6 with openings 8' is formed on device 10 to define the space where N-wells are to be formed. The mask 8 is formed on the substrate 12 and silicon oxide film 7 by employing photolithography. Then P- dopant ions 14' are ion-implanted at an energy of about 120 keV with a dose of about $1.4 \times 10^{13}$ ions/cm$^2$ through the opening 8' in the mask 8 so as to form an P-ion-implanted dopant layer 14 into the surface of the silicon substrate 12.

Figure 3B:
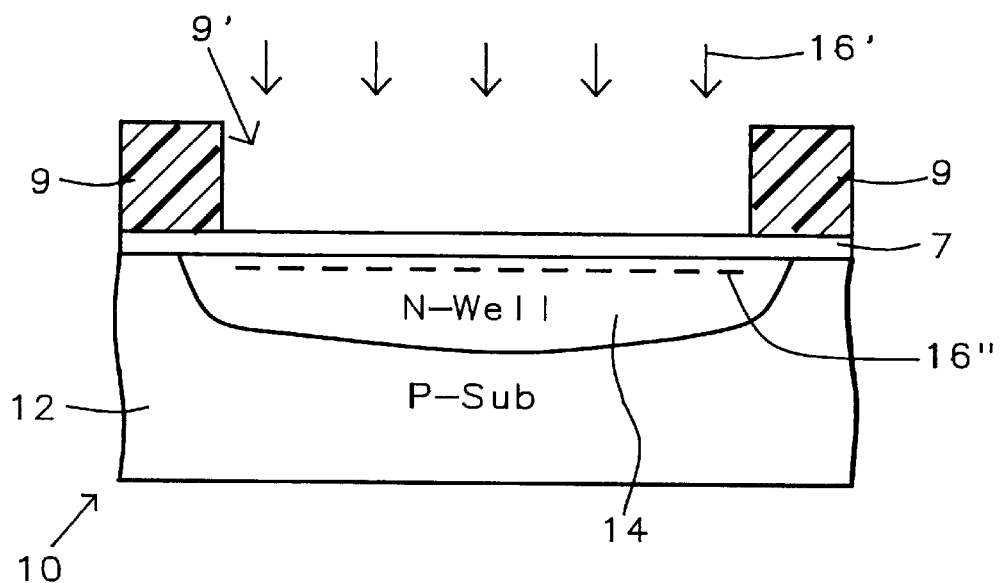
FIG. 3B show the device of FIG. 3A after the mask has been removed and the device has been annealed to form the N-well.

Referring to FIG. 3B, the device of FIG. 3A is shown after the photoresist mask 8 has been removed and the device has been annealed at a temperature of about 1150° C. for a time duration of about 30 minutes to form the N-well 14 from dopant layer 14" yielding a concentration of N- dopant of about $1 \times 10^{16}$ atoms/cm$^3$.

Then, again referring to FIG. 3B, a photoresist mask 9 with an opening 9' has been formed (by photolithography) over the N-well 14. Next, P- dopant ions 16' are ion-implanted (at an energy of about 40 keV with a dose of about $2.9 \times 10^{13}$ ions/cm$^2$ through opening 9' (in photoresist mask 9) into the surface of the N-well 14 in silicon substrate 12 so as to form an P-ion-implanted dopant layer 16" in the surface of N-well 14. The photoresist mask 9 is thereafter removed.

Figure 3C:
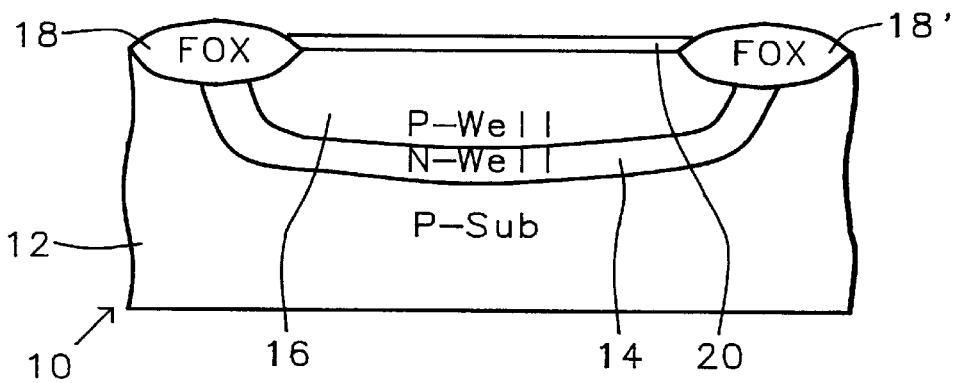
FIG. 3C shows the device of FIG. 3B after the silicon dioxide film has been removed exposing the surface of the substrate with the wells formed therein.

Then annealing is performed so as to form a P well 16 (as seen in FIG. 3C) in a surface region of the N-well 14 from dopant layer 16". The annealing is performed at a temperature of about 1150° C. for a time duration of about thirty (30) minutes yielding a concentration of P- dopant of about $2 \times 10^{16}$ atoms/cm$^3$.

FIG. 3C shows the device of FIG. 3B after the silicon dioxide film 7 has been removed exposing the surface of the substrate 12 with the wells formed therein.

As shown in FIG. 3C, above the periphery of the N-well 14 Field OXide (FOX) regions 18, 18' are formed by a conventional LOCOS (LOCal Oxidation of Silicon) process. The thickness of the FOX regions 18, 18' is approximately 6000 Å.

A gate oxide film 20, about 100 Å thick, is formed within the boundaries of the FOX regions 18, 18' on the surface of P-well 16 in the silicon substrate 12.

Figure 3D:
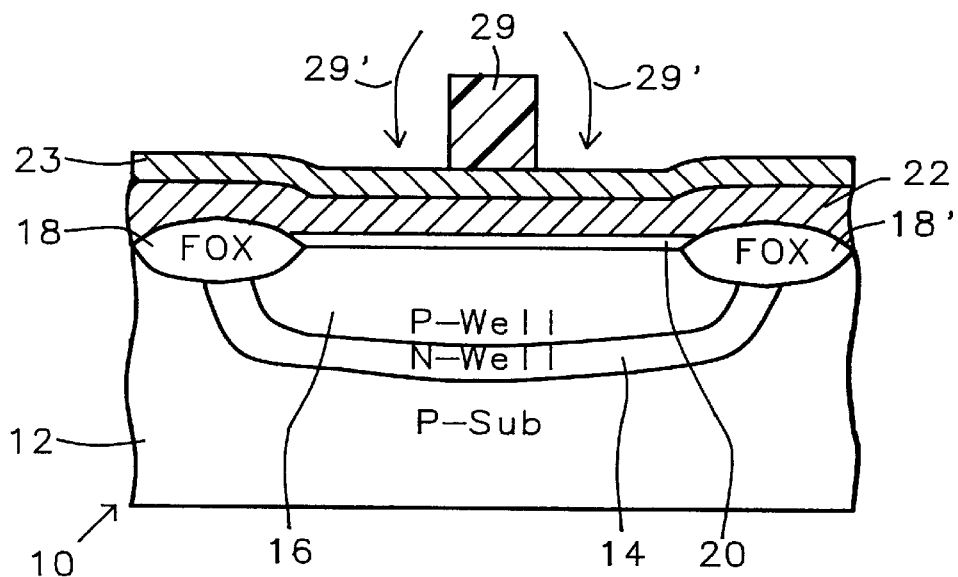
FIG. 3D shows the device of FIG. 3C after a prior art polysilicon film has bean formed on the overall surface of the gate oxide layer and the FOX regions and then doped. A polycide film has bean formed on the polysilicon film. A gate electrode stack mask has been formed over the polycide film.

FIG. 3D shows the device of FIG. 3C after a polysilicon film 22 has been formed on the overall surface of the gate oxide layer 20 and the FOX regions 18, 18' and then doped with POCl$_3$. The polysilicon film 22 is about 1,500 Å thick. A polycids film 23 is then formed on the polysilicon film 22. The polycide film 23 is from about 1,500 Å thick.

A photoresist, gate electrode stack mask 29 has been formed over the polycide film 23 in the region where the FET of this invention is to be formed.

The photoresist, gate electrode stack mask 29 is patterned by photolithography with openings 29' everywhere in FIG. 3D, except where the gate electrode stack 39 is to be formed. Thereafter, the polycide film 23, the polysilicon film 22, and the gate oxide layer 20 are etched, through those openings 29' in the photoresist mask 29, with the gate electrode stack 39 of the FET remaining comprising the gate oxide layer 20, the polysilicon film 22 and polycide film 23.

Figure 3E:
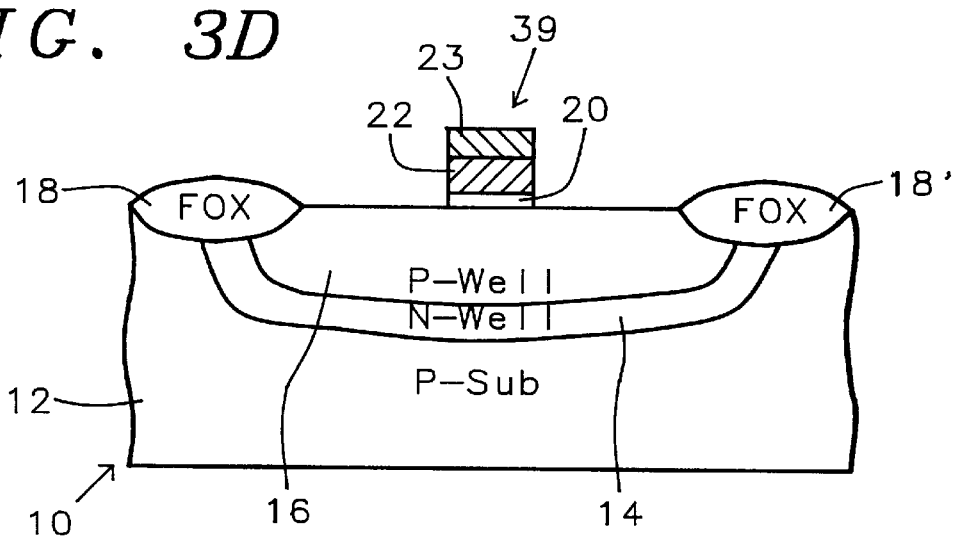
FIG. 3E shows the device of FIG. 3D after the mask has been removed leaving the gate electrode stack formed by etching of the three layers including the gets oxide layer, the polysilicon film and the polycide film.

FIG. 3E shows the device of FIG. 3D after the photoresist mask 29 has been removed leaving the gate electrode stack 39 (which was formed by the etching step.) The stack 39 comprises the three layers including the gate oxide layer 20, the polysilicon film 22 and the polycide film 23.

Figure 3F:
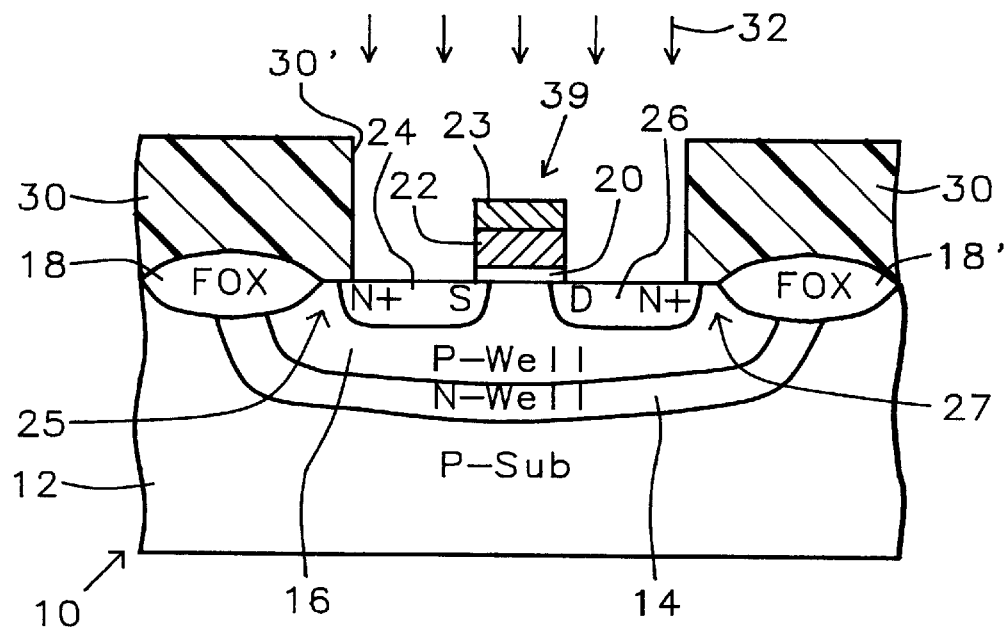
FIG. 3F shows the device of FIG. 3E after a mask with a source/drain opening therethrough is formed on the device through which dopant is being ion-implanted. The mask, plus the gate electrode stack of polycide film, polysilicon film and gate oxide layer serve as self-aligned masks used in forming the N+ source/drain regions in the P-well.

FIG. 3F shows the device of FIG. 3E after formation of photoresist source/drain mask 30 with a source/drain opening 30' therethrough on the device 10. Source/drain dopant 32 comprises arsenic (As) ion-implanted (at an energy of (about 60 keV with a dose of about $1 \times 10^{21}$ ions/cm$^2$ through the opening 30' in source/drain mask 30.

The photoresist mask 30, plus the gate electrode stack of polycide film 23, polysilicon film 22 and gate oxide layer 20 serve as self-aligned masks used in forming the N+ source/drain regions 24/26 in the P-well 16. The source/drain regions have a concentration of N+ dopant from about $1 \times 10^{20}$ atoms/cm$^3$ to about $1 \times 10^{21}$ atoms/cm$^3$.

In the case of formation of a conventional lightly doped drain (LDD) dopant structures adjacent to the source/drain regions phosphorus dopant is ion-implanted through the source/drain mask at an energy of about 60 keV with a does from about $5 \times 10^{17}$ ions/cm$^2$ to about $1 \times 10^{18}$ ions/cm$^2$, prior to formation of source/drain regions 24/26.

Figure 3G:
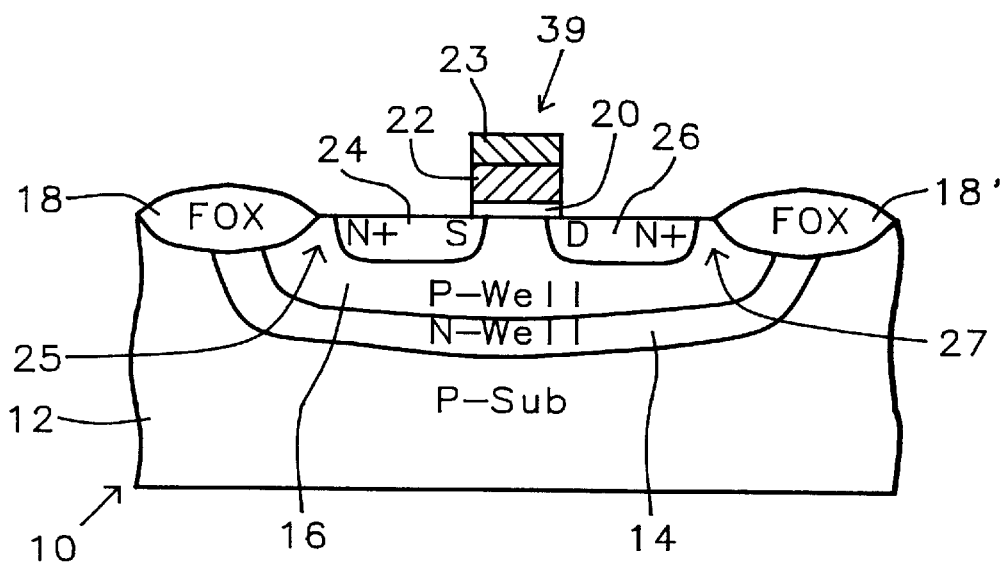
FIG. 3G shows the device of FIG. 3F after the mask has been removed leaving the device as seen in FIG. 3G, which is the same as the device seen in FIG. 1B.
Figure 4:
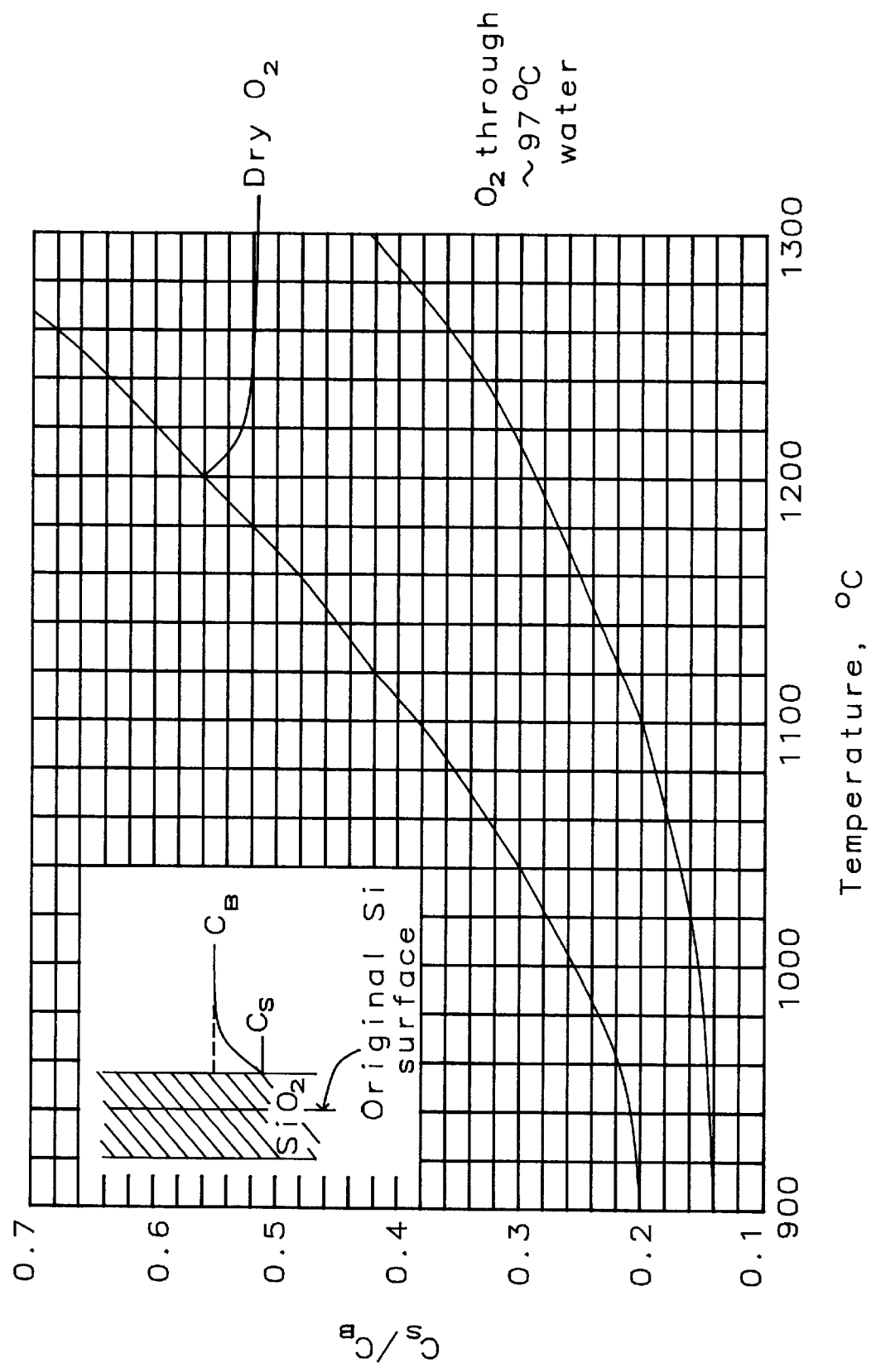
FIG. 4 is a chart of the ratio $C_S/C_B$ (surface/bulk concentrations) vs. temperature for boron concentration distribution, due to thermal oxidation during manufacturing.

FIG. 3G shows the device of FIG. 3F after the photoresist source/drain mask 30 has been removed leaving the device as seen in FIG. 3G, which is the same as the device seen in FIG. 1B.

Then the back end of the line steps follow completing the device as will be well understood by those skilled in the art.

A P- field is implanted (B 150 keV, $4 \times 10^{12}$ ions/cm$^3$) through a FOX region to compensate for the dosage redistribution. While in non-FOX region, this implant is far away from the surface of the substrate. Thus the maximum electric field is located at 127 in FIG. 2B due to the maximum concentration of N+, P+ atoms located there.

Figure 5:
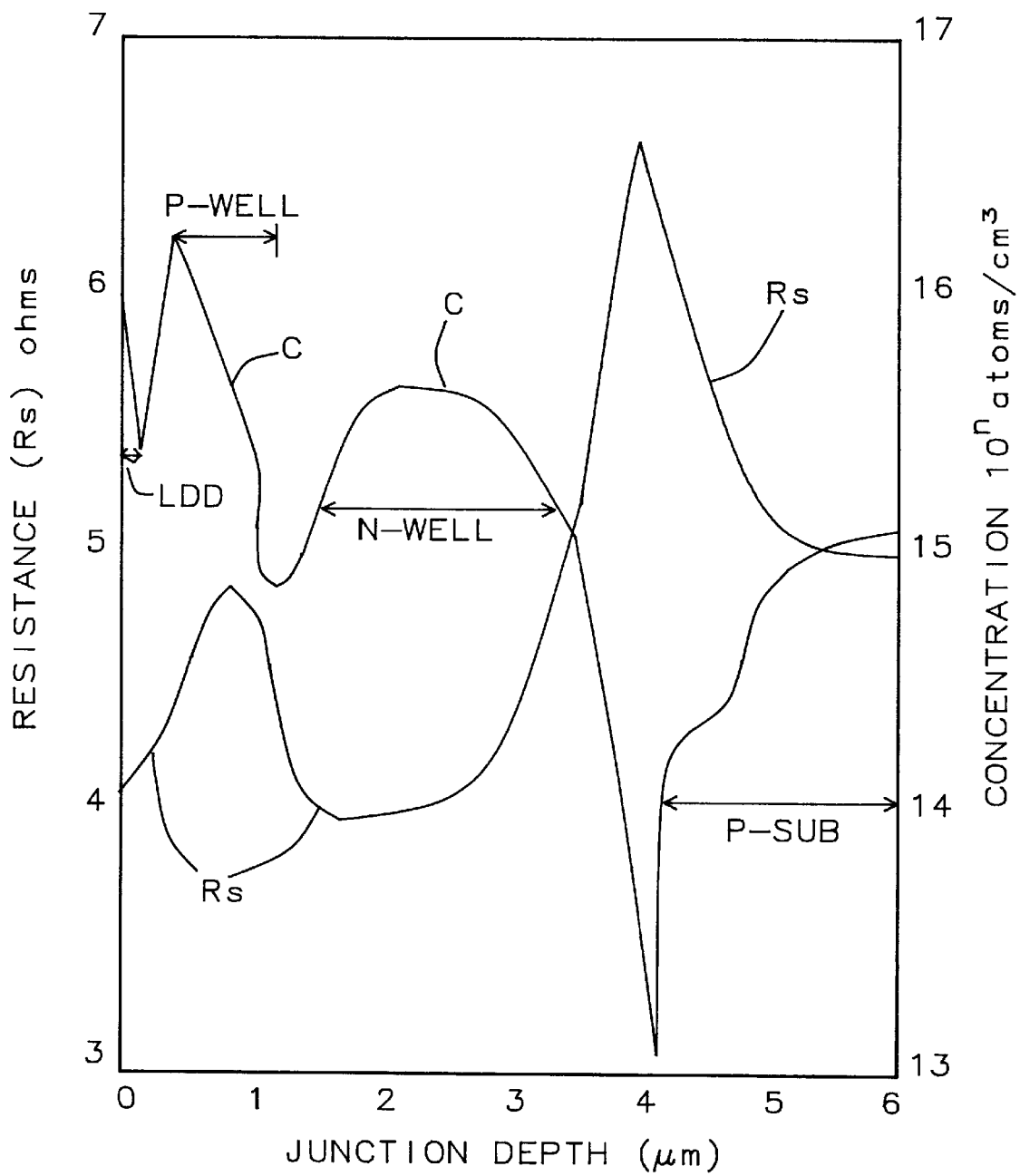
FIG. 5 shows, for the channel of the device of FIGS. 1A 1B and 3G, a pair of curves of concentration C in units of $10^n$ atoms/cm$^3$ and Resistance $R_S$ in ohms vs. Junction Depth in micrometers (μM).

FIG. 5 shows, for the channel of the device 10 of FIGS. 1A 1B and 3G, a pair of curves of concentration C in units of $10^n$ atoms/cm$^3$ and Resistance $R_S$ in ohms vs. Junction Depth in micrometers ($\mu$m). The values are seen for an LDD region, the P-well region, the N-well region, and the P-substrate (P-sub.)

Appendix: The peak point regions (positive or negative) show implant layer junctions.

Figure 6:
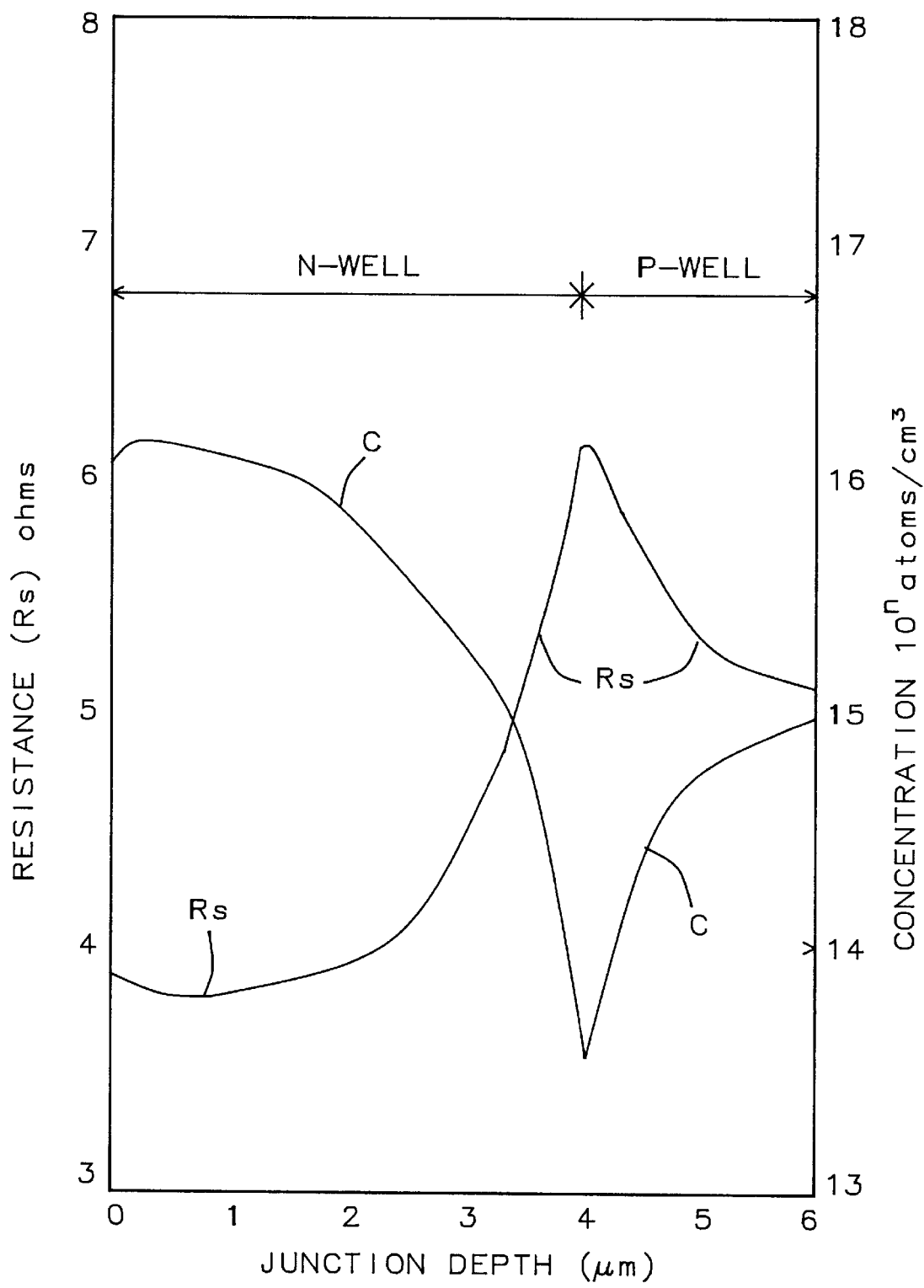
FIG. 6 shows, for the FOX region of the device of FIGS. 1A 1B and 3G, a pair of curves of concentration C in units of $10^n$ atoms/cm$^3$ and Resistance $R_S$ in ohms vs. Junction Depth in micrometers (μm) for the P-well region and the P-substrate (P-sub.)

FIG. 6 shows, for the FOX region of the device 10 of FIGS 1A 1B and 3G, a curve of concentration C in units of $10^n$ atoms/cm$^3$ and a curve of Resistance $R_S$ in ohms vs. Junction Depth in micrometers ($\mu$m) for the P-well region and the P-substrate (P-sub.) These two curves predict that the P-well disappears due to FOX oxidation causing dosage redistribution. Thus the only edit is the N-well to P-substrate Junction.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention what is claimed as new and desirable to be secured by Letters Patent is as follows:

1. A method of forming a semiconductor FET device in a doped silicon semiconductor substrate having a surface, said FET device including source/drain regions doped with a first conductivity type of dopant formed in a doped region comprising a well in said substrate, said well being doped with an opposite conductivity type of dopant from said source/drain regions, field oxide regions formed on said surface of said substrate located above borders between said well and regions of said substrate surrounding said well, said method including the steps as follows:

forming a gate electrode structure over said well between said field oxide regions, forming a source/drain mask with an opening over said gate electrode structure, and said mask covering said substrate including said field oxide regions with a margin extending beyond said field oxide regions over said substrate towards said gate electrode structure thereby providing source/drain openings through said mask, said source/drain openings being spaced away from said field oxide regions, and ion implanting a source region and a drain region in said surface of said substrate through said openings in said source/drain mask, said source region and said drain region being self-aligned with said gate electrode structure with said source region and said drain region being spaced away from said field oxide regions by a distance greater than or equal to 0.7 $\mu$m, whereby breakdown is avoided in said doped region between said source region and said field oxide regions and between said drain region and said field oxide regions.

2. A method in accordance with claim 1 wherein:

said source/drain dopant comprises arsenic ion-implanted at an energy of about 60 keV through said source/drain mask.

3. A method in accordance with claim 1 wherein:

said source/drain regions extend below said surface of said substrate from about 0.2 $\mu$m to about 0.3 $\mu$m deep.

4. A method in accordance with claim 1 wherein:

said doped region comprises a P-well formed in said substrate which is doped by dopant comprising boron ion-implanted at an energy of about 40 keV with a dose from about $2.9 \times 10^{13}$ ions/cm$^2$, which after annealing at about 1150° C. for about 30 minutes yielded a concentration of about $2 \times 10^{16}$ atoms/cm$^3$, said P-well is formed in an N-well, and said N-well is doped by dopant comprising boron ion-implanted at an energy of about 120 keV with a dose of about $1.4 \times 10^{13}$ ions/cm$^2$, which after annealing at about 1150° C. for about 30 minutes yielded a concentration of about $1 \times 10^{16}$ atoms/cm$^3$.

5. A method of forming a semiconductor FET device in a doped silicon semiconductor substrate having a surface, said substrate being doped with a first conductivity type of dopant, an N-well formed in said surface of said substrate said N-well being doped with an opposite conductivity type of dopant from said first type, a P-well formed in said N-well, said P-well being doped with said first conductivity type of dopant, field oxide regions formed on said surface of said substrate located above borders between said wells and regions of said substrate surrounding said wells, said method including the steps as follows:

forming an N-well in said surface of said substrate, said N-well being doped with an N type of dopant, forming a P-well in said surface of said N-well, said P-well being doped with a P type of dopant, forming field oxide regions on said surface of said substrate located above borders between said N-well, said P-well and regions of said substrate surrounding said wells, forming a gate electrode structure over said P-well between said field oxide regions, forming a source/drain mask with an opening over said gate electrode structure, and said mask covering said substrate including field oxide regions with a margin extending beyond said field oxide regions over said substrate towards said gate electrode structure thereby providing source/drain openings through said mask, said source/drain openings being spaced away from said field oxide regions, and ion implanting a source region and a drain region through said openings in said source/drain mask in said surface of said P-well, said source region and said drain region being self-aligned with said gate electrode structure with said source region and said drain region being spaced away from said field oxide regions by a gap of greater than or equal to 0.7 µm, whereby breakdown is avoided in said P-well between said source region and said field oxide regions and between said drain region and said field oxide region.

6. A method in accordance with claim 5 wherein:

said source/drain dopant comprises arsenic ion-implanted at an energy of about 60 keV through said source/drain mask.

7. A method in accordance with claim 5 wherein:

said source/drain regions extend below the surface of said P-well from about 0.2 µm to about 0.3 µm deep.

8. A method in accordance with claim 5 wherein:

said N-well is doped by dopant comprising phosphorus ion-implanted at an energy of about 120 keV through said source/drain mask, and said P-well is doped by dopant comprising boron ion-implanted at an energy of about 40 keV through said source/drain mask.

9. A method in accordance with claim 5 wherein:

lightly doped drain dopant for said source/drain regions comprises phosphorus ion-implanted at an energy of about 60 keV through said source/drain mask, and said source/drain regions extend below the surface of said P-well from about 0.15 µm to about 0.2 µm deep.

10. A method in accordance with claim 5 wherein:

said source/drain dopant in N+ regions comprises arsenic ion-implanted at an energy of about 60 keV through said source/drain mask, said source/drain regions extend below the surface of said P-well from about 0.2 µm to about 0.3 µm deep, said N-well is doped by dopant comprising phosphorus ions implanted through an N-well mask at an energy of about 120 keV, and said P-well is doped by dopant comprising boron ions implanted through a P-well mask at an energy of about 40 keV.

11. A method of forming a semiconductor FET device in a doped silicon semiconductor substrate having a surface, said method including the steps as follows:

doping said substrate with a P type of dopant, forming an N-well in said surface of said substrate from about 1.8 µm to about 4 µm deep, said N-well being doped with an N type of dopant, forming a P-well in said surface of said N-well from about 0.4 µm to about 1 µm deep, said P-well being doped with a P type of dopant, forming field oxide regions on said surface of said substrate located above borders between said N-well, said P-well and regions of said substrate surrounding said wells, forming a gate electrode structure over said P-well between said field oxide regions, forming a source/drain mask with an opening over said gate electrode structure, and said mask covering said substrate including field oxide regions with a margin extending beyond said field oxide regions over said substrate towards said gate electrode structure thereby providing source/drain openings through said mask, said source/drain openings being spaced away from said field oxide regions, and ion implanting a source region and a drain region through said opening in said source/drain mask in said surface of said substrate, said source region and said drain region being self-aligned with said gate electrode structure with said source region and said drain region being spaced away from said field oxide regions by a distance greater than or equal to 0.7 µm.

12. A method in accordance with claim 11 wherein: said source/drain dopant comprises arsenic ion-implanted at an energy of about 60 keV through said source/drain mask.

13. A method in accordance with claim 11 wherein: said source/drain regions extend below said surface of said substrate from about 0.2 µm to about 0.3 µm deep.

14. A method in accordance with claim 11 wherein: said well is doped by dopant comprising boron ion-implanted at an energy of about 40 keV through said source/drain mask.

15. A method of forming an FET semiconductor device in a doped silicon semiconductor substrate having a surface, said substrate being doped with a first conductivity type of dopant, an N-well formed in said surface of said substrate said N-well being doped with an opposite conductivity type of dopant from said first conductivity type, a P-well formed in said N-well, said P-well being doped with said first conductivity type of dopant, field oxide regions formed on said surface of said substrate located above borders between said wells and regions of said substrate surrounding said wells, said method including the steps as follows:

forming a gate electrode structure over said P-well including a gate oxide layer about 100 Å thick, a polysilicon layer about 1,500 Å thick and a polycide layer about 1,500 Å thick between said field oxide regions, forming a source/drain mask with en opening over said gate electrode structure, and said mask covering said substrate including field oxide regions with a margin extending beyond said field oxide regions over said substrate towards said gate electrode structure thereby providing source/drain openings through said mask spaced away from said field oxide regions, and ion implanting a source region and a drain region in said surface of said P-well through said opening in said source/drain mask, said source region and said drain region being self-aligned with said gate electrode structure with said source region and said drain region being spaced away from said field oxide regions by a gap of greater than or equal to about 0.7 µm.

16. A method in accordance with claim 15 wherein: said source/drain dopant comprises arsenic ion- implanted at an energy of about 60 keV through said source/drain mask.

17. A method in accordance with claim 15 wherein: said source/drain regions extend below the surface of said P-well from about 0.2 µm to about 0.3 µm deep.

18. A method in accordance with claim 15 wherein:

said N-well is doped by dopant comprising phosphorus ion-implanted at an energy of about 120 keV through said source/drain mask, and said P-well is doped by dopant comprising boron ion-implanted at an energy of about 40 keV through said source/drain mask.

19. A method in accordance with claim 15 wherein:

LDD dopant for said source/drain regions comprises phosphorus ion-implanted at an energy of about 60 keV through said source/drain mask, and said source/drain regions extend below the surface of said P-well from about 0.15 μm to about 0.2 μm deep.

20. A method in accordance with claim 15 wherein said source/drain dopant in N+ regions comprises arsenic ion-implanted at an energy of about 60 keV through said source/drain mask, said source/drain regions extend below the surface of said P-well from about 0.2 μm to about 0.3 μm deep, said N-well is doped by dopant comprising phosphorus ions implanted through an N-well mask at an energy of about 120 keV, and said P-well is doped by dopant comprising boron ions implanted through a P-well mask at an energy of about 40 keV.

* * * * *